(12) United States Patent
Dai et al.

(10) Patent No.: US 11,443,989 B2
(45) Date of Patent: Sep. 13, 2022

(54) ARRAY SUBSTRATE, DISPLAY PANEL, METHOD OF FABRICATING DISPLAY PANEL, AND MOTHER SUBSTRATE

(71) Applicants: Hefei BOE Display Technology Co., Ltd., Anhui (CN); BOE Technology Group Co., Ltd., Beijing (CN)

(72) Inventors: Ke Dai, Beijing (CN); Peng Jiang, Beijing (CN); Yanping Liao, Beijing (CN); Wenchao Wang, Beijing (CN)

(73) Assignees: Hefei BOE Display Technology Co., Ltd., Anhui (CN); Beijing BOE Technology Development Co., Ltd., Beijing (CN)

( * ) Notice: Subject to any disclaimer, the term of this patent is extended or adjusted under 35 U.S.C. 154(b) by 475 days.

(21) Appl. No.: 16/498,777

(22) PCT Filed: May 8, 2019

(86) PCT No.: PCT/CN2019/086033
§ 371 (c)(1),
(2) Date: Sep. 27, 2019

(87) PCT Pub. No.: WO2020/098235
PCT Pub. Date: May 22, 2020

(65) Prior Publication Data
US 2021/0407868 A1    Dec. 30, 2021

(30) Foreign Application Priority Data
Nov. 16, 2018   (CN) .......................... 201811365617.8

(51) Int. Cl.
*H01L 27/12*    (2006.01)
*H01L 21/66*    (2006.01)
(Continued)

(52) U.S. Cl.
CPC .......... *H01L 22/32* (2013.01); *G02F 1/13452* (2013.01); *G02F 1/136254* (2021.01);
(Continued)

(58) Field of Classification Search
CPC ....... H01L 22/32; H01L 22/12; H01L 27/124; H01L 27/1259; H01L 24/73;
(Continued)

(56) References Cited

U.S. PATENT DOCUMENTS

2014/0098005 A1    4/2014   Kim et al.

FOREIGN PATENT DOCUMENTS

| CN | 105182640 A  | 12/2015 |
| CN | 107065364 A  | 8/2017  |
| KR | 20060134263 A | 12/2006 |

OTHER PUBLICATIONS

First Office Action in the Chinese Patent Application No. 201811365617.8, dated Mar. 30, 2020; English translation attached.

*Primary Examiner* — Elias Ullah
(74) *Attorney, Agent, or Firm* — Intellectual Valley Law, P.C.

(57) ABSTRACT

An array substrate having a display area, a peripheral area, and a bonding area inside the peripheral area is provided. The array substrate includes a bonding pad in the bonding area, the bonding pad configured to be connected to a peripheral circuit through a bonding connector, a test signal line including a first portion and a second portion. The first portion is in the peripheral area and substantially surrounds the display area. The first portion is electrically connected to the bonding pad. The first portion is completely inside the array substrate and has no exposed terminal. The second portion is in the bonding area. A first terminal of the second portion is electrically connected to the bonding pad. A
(Continued)

second terminal of the second portion has an end along an edge of the array substrate in the bonding area.

20 Claims, 6 Drawing Sheets

(51) Int. Cl.
    *G02F 1/1362*     (2006.01)
    *G02F 1/1345*     (2006.01)
    *H01L 23/00*     (2006.01)

(52) U.S. Cl.
    CPC ............ *H01L 22/12* (2013.01); *H01L 27/124* (2013.01); *H01L 27/1259* (2013.01); *G02F 1/136263* (2021.01); *H01L 24/73* (2013.01); *H01L 2224/73204* (2013.01)

(58) Field of Classification Search
    CPC ....... H01L 2224/73204; H01L 27/1244; G02F 1/13452; G02F 1/136254; G02F 1/136263; G02F 1/1309; G02F 1/136286; G02F 1/1362
    See application file for complete search history.

ARRAY SUBSTRATE, DISPLAY PANEL, METHOD OF FABRICATING DISPLAY PANEL, AND MOTHER SUBSTRATE

CROSS-REFERENCE TO RELATED APPLICATION

This application is a national stage application under 35 U.S.C. § 371 of International Application No. PCT/CN2019/086033, filed May 8, 2019, which claims priority to Chinese Patent Application No. 201811365617.8, filed Nov. 16, 2018. Each of the forgoing applications is herein incorporated by reference in its entirety for all purposes

TECHNICAL FIELD

The present invention relates to display technology, more particularly, to an array substrate, a display panel, a method of fabricating a display panel, and a mother substrate.

BACKGROUND

During the process of fabricating an array substrate, testing the array substrate is an important process. In the process of testing the array substrate, a data line is connected to the testing pad through a test signal line. A testing signal is sent to the array substrate from the testing pad thought the testing signal line to test the array substrate.

SUMMARY

In one aspect, the present invention provides an array substrate having a display area, a peripheral area, and a bonding area inside the peripheral area, comprising a bonding pad in the bonding area, the bonding pad configured to be connected to a peripheral circuit through a bonding connector, a test signal line comprising a first portion and a second portion; wherein the first portion is in the peripheral area and substantially surrounds the display area; the first portion is electrically connected to the bonding pad; the first portion is completely inside the array substrate and has no exposed terminal; the second portion is in the bonding area; a first terminal of the second portion is electrically connected to the bonding pad; and a second terminal of the second portion has an end along an edge of the array substrate in the bonding area.

Optionally, the array substrate further comprises a plurality of data lines extending along a direction from the bonding area to a side of the array substrate opposite to the bonding area; wherein the test signal line is an array data pad opposite data (ADD) line for detecting defects in the plurality of data lines of the array substrate.

Optionally, the test signal line is electrically connected to the plurality of data lines on the side of the array substrate opposite to the bonding area.

Optionally, the array substrate further comprises a plurality of electrostatic discharge shorting structures on the side of the array substrate opposite to the bonding area; wherein the test signal line is electrically connected to the plurality of data lines respectively through the plurality of electrostatic discharge aborting structures.

Optionally, the test signal line and the plurality of data lines are in a same layer and comprise a same material.

Optionally, the array substrate further comprises a plurality of gate lines extending along a direction from a first lateral side of the array substrate to a second lateral side of the array substrate, the first lateral side and the second lateral side respectively connecting a side of the array substrate having the bonding area and a side of the array substrate opposite to the bonding area; wherein the array substrate is absent of any exposed ends of the test signal line along edges of the first lateral side and the second lateral side of the array substrate.

Optionally, the test signal line and the plurality of gate lines are in a same layer and comprise a same material.

Optionally, the array substrate further comprises a ground voltage line and a common voltage signal line in the peripheral area; wherein the test signal line does not cross over the ground voltage line and does not cross over the common voltage signal line.

Optionally, the end of the second terminal of the second portion is configured to be covered by the bonding connector.

In another aspect, the parent invention provides a display panel, comprising the array substrate described herein; a counter substrate facing the array substrate; the bonding connector connected to the bonding pad; and a peripheral circuit connected to the bonding pad through the bonding connector.

Optionally, the display panel further comprises a data driving circuit in the bonding area.

Optimally, the display panel further comprises a gate driving circuit in the bonding area.

Optionally, the bonding connector comprises a flexible protective film and a bonding connection line protected by the flexible protective film.

In another aspect, the present invention provides a method of fabricating an array substrate having a display area, a peripheral area, and a bonding area inside the peripheral area, comprising forming a bonding pad in the bonding area, the bonding pad configured to be connected to a peripheral circuit through a bonding connector, forming a test signal line comprising a first portion and a second portion; wherein the first portion is formed in the peripheral area and substantially surrounds the display area; the first portion is electrically connected to the bonding pad; the first portion is completely inside the array substrate and has no exposed terminal; the second portion is formed in the bonding area; a first terminal of the second portion is electrically connected to the banding pad; and a second terminal of the second portion has an end along an edge of the array substrate in the bonding area.

Optionally, the method comprises forming a mother substrate having a plurality of substrate regions and a cutting region spacing apart the plurality of substrate regions, wherein components of the array substrate are formed in a respective one of the plurality of substrate regions; cutting the mother substrate along a border between the respective one of the plurality of substrate regions and the cutting region, thereby forming the array substrate.

Optionally, forming the mother substrate comprises forming an array substrate in a respective one of the plurality of substrate regions; and forming a testing pad in the cutting region; wherein the array substrate has a display area, a peripheral area, and a bonding area inside the peripheral area. Optionally, forming the array substrate comprises forming a bonding pad in the bonding area, the bonding pad configured to be connected to a peripheral circuit through a bending connector; forming a test signal line comprising a first portion and a third portion; wherein the first portion is formed in the peripheral area and substantially surrounds the display area; the first portion is electrically connected to the bonding pad; the first portion is completely inside the array substrate and has no exposed terminal; the third portion extends from the bonding area into the cutting region to connect to the testing pad; a first terminal of the third portion is electrically connected to the bonding pad; and a second terminal of the third portion is electrically connected to the testing pad.

Optionally, forming the array substrate further comprises forming a plurality of data lines extending along a direction from the bonding area to a side of the array substrate opposite to the bonding area. Optionally, subsequent to forming the mother substrate and prior to cutting the mother substrate, the method further comprises transmitting a test signal to the test signal line through the testing pad to detect defects in the plurality of data lines of the array substrate.

Optionally, cutting the mother substrate along the border between the respective one of the plurality of substrate regions and the cutting region cuts the third portion along an edge of the array substrate in the bonding area, thereby forming the second portion; a first terminal of the second portion is electrically connected to the banding pad; and a second terminal of the second portion has an end along the edge of the array substrate in the bonding area; and the end of the second terminal of the second portion is configured to be covered by the bonding connector.

Optionally, subsequent to cutting the mother substrate, the method further comprises applying a protective adhesive layer to cover the end of the second terminal of the second portion.

Optionally, the end of the second terminal of the second portion is covered by the bonding connector.

In another aspect, the present invention provides a method of fabricating a display panel, comprising the method of fabricating the array substrate described herein; connecting the bonding connector to the bonding pad, wherein the end of the second terminal of the second portion is covered by the bonding connector; connecting a peripheral circuit to the bonding pad through the banding connector providing a counter substrate facing the array substrate; and assembling the array substrate and the counter substrate into a cell.

In another aspect, the present invention provides a mother substrate having a plurality of substrate regions and a cutting region spacing apart the plurality of substrate regions, comprising an array substrate in a respective one of the plurality of substrate regions; and a testing pad in the cutting regions. Optionally, the array substrate has a display area, a peripheral area, and a bonding area inside the peripheral area. Optionally, the array substrate comprises a bonding pad in the bonding area, the bonding pad configured to be connected to a peripheral circuit through a bonding connector, a test signal line comprising a first portion and a third portion; wherein the first portion is in the peripheral area and substantially surrounds the display area; the first portion is electrically connected to the bonding pad; the first portion is completely inside the array substrate and has no exposed terminal; the third portion extends from the bonding area into the cutting region to connect to the testing pad; a first terminal of the third portion is electrically connected to the bonding pad; and a second terminal of the third portion is electrically corrected to the testing pad.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Testing array substrates are performed before cutting the mother substrates to form multiple array substrates. To test an array substrate, a testing signal line extends from a cutting region of mother substrate to a substrate region having the array substrate, after testing the array substrate, the mother substrate is cut to form the array substrate, and the testing signal line is cut along an edge of the array substrate. Therefore, a surface of the testing signal line at the cutting edge of the array substrate is exposed to air. Lacking protection, a longtime exposure will cause the exposed surface of the testing signal line to be eroded or to have electrostatic damages, resulting in adversary effect on the display performance of the array substrate.

Accordingly, the present disclosure provides, inter alia, an array substrate, a display panel, a method of fabricating a display panel, and a mother substrate that substantially obviate one or more of the problems due to limitations and disadvantages of the related art. In one aspect, the present disclosure provides an array substrate having a display area, a peripheral area, and a bonding area inside the peripheral area, including a bonding pad in the bonding area, the bonding pad configured to be connected to a peripheral circuit through a bonding connector, a test signal line including a first portion and a second portion. In some embodiments, the first portion is in the peripheral area and substantially surrounds the display area. Optionally, the first portion is electrically connected to the bonding pad. Optionally, the first portion is completely inside the array substrate and has no exposed terminal. In some embodiments, the second portion is in the bonding area. Optionally, a first terminal of the second portion is electrically connected to the bonding pad. Optionally, a second terminal oldie second portion has an end (e.g., an exposed end) along an edge of the array substrate in the bonding area. Optionally, the end of the second terminal of the second portion is configured to be covered by the bonding connector.

Figure 1:
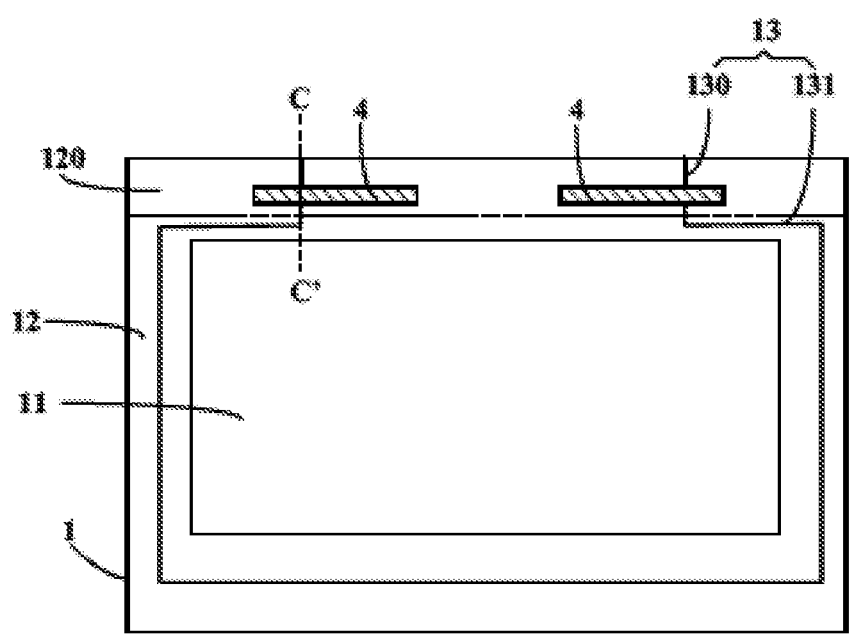
FIG. 1 is a plan view of an array substrate in some embodiments according to the present disclosure.

FIG. 1 is a plan view of an array substrate in some embodiments according to the present disclosure. Referring to FIG. 1, in some embodiments, the array substrate 1 includes a display area 11, a peripheral area 12, and a bonding area 120 inside the peripheral area 12. Optionally, the peripheral area 12 surrounds the display area 11.

As used herein, the term "display area" refers to an area of the display substrate (e.g. an array substrate) where image is actually displayed. Optionally, the display area may include both a subpixel region and an inter-subpixel region. A subpixel region refers to a light emission region of a subpixel, such as a region corresponding to a pixel electrode in a liquid crystal display or a region corresponding to a light emissive layer in an organic light emitting display. An inter-subpixel region refers to a region between adjacent subpixel regions, such as a region corresponding to a black matrix in a liquid crystal display or a region corresponding a pixel definition layer in an organic light emitting display. Optionally, the inter-subpixel region is a region between adjacent subpixel regions in a same pixel. Optionally, the inter-subpixel mean is a region between two adjacent subpixel regions from two adjacent pixels.

As used herein the term "peripheral area" refers to an area of a display substrate (e.g. an array substrate) in a display panel where various circuits and wires are provided to transmit signals to the display substrate. To increase the transparency of the display apparatus, non-transparent or opaque components of the display apparatus (e.g., battery, printed circuit board, metal frame), can be disposed in the peripheral area rather than in the display areas. Optionally, the peripheral area surrounds the display area.

As used herein the term "bonding area" refers an area of a display substrate (e.g. an array substrate) in a display panel where a peripheral circuit bonds to the array substrate. Optionally, the bonding area is inside the peripheral area.

In some embodiments, the array substrate 1 includes a bonding pad 4 in the bonding area 120 and a test signal line 13. Optionally, the bonding pad 4 is configured to be connected to a peripheral circuit through a bonding connector. Optimally, the bonding pad 4 is configured to receiving a test signal.

In some embodiments, the test signal line 13 includes a first portion 131 and a second portion 130. In some embodiments, the first portion 131 is in the peripheral area 12 and substantially surrounds the display area 11.

As used herein the term "substantially surround" refers to surround at least 50% (e.g., at least 60%, at least 70%, at least 80%, at least 90%, at least 95%, at least 99%, and 100%) of a perimeter of an area. For example, the first portion 131 of the test signal line 13 substantially surrounds at least 80% of the display area 11.

Optionally, the first portion 131 is electrically connected to the bonding pad 4. Optionally, the first portion 131 is completely inside the array substrate 1 and has no exposed terminal.

Figure 2:
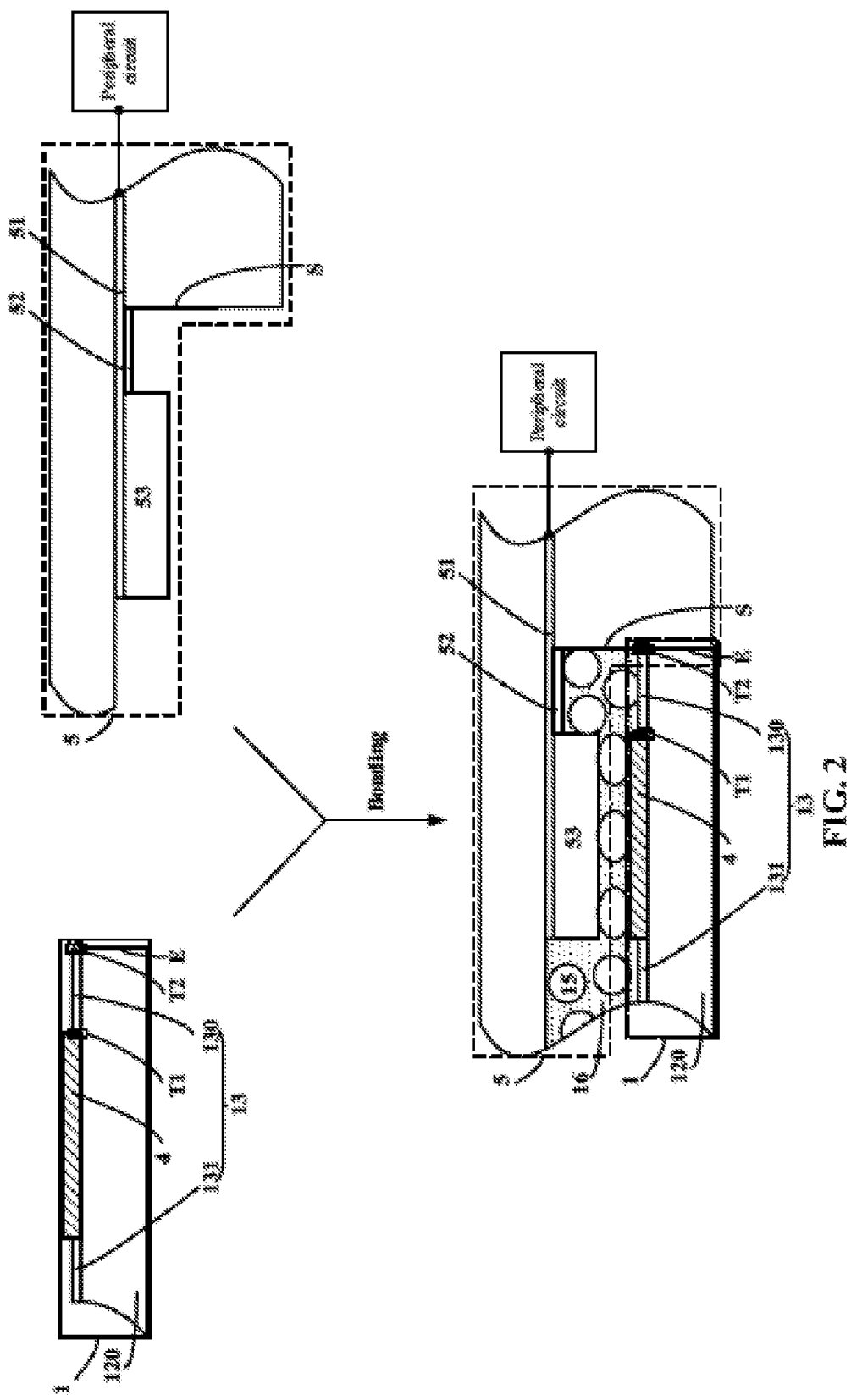
FIG. 2 is a partial cross-sectional view illustrating an array substrate connected a bonding connector in some embodiments according to the present disclosure.

FIG. 2 is a partial cross-motional view illustrating an array substrate connected a bowling connector in some embodiments according to the present disclosure. FIG. 2 shows a partial cross-sectional view adz array substrate along CC' direction in FIG. 1. Referring to bath FIG. 1 and FIG. 2, in some embodiments, the second portion 130 of the test signal line 13 is in the bonding area 120. Optionally, a first terminal T1 of the second portion 130 of the test signal line 13 is electrically connected to the bonding pad 4. By connecting the first terminal T1 of the second portion 130 of the test signal line 13 to the bonding pad 4, and connecting the first portion 131 of the test signal line 13 to the bonding pad 4, the first portion 131 and the second portion 130 of the test signal line 13 are electrically connected together.

Optionally, referring to FIG. 2, a second terminal 12 of the second portion 130 has an end (e.g., an exposed end) along an edge E of the array substrate in the bonding area 120. For example, the end of the second terminal T2 of the second portion 130 of the test signal line 13 is substantially parallel to the edge of the array substrate. Optionally, the end of the second terminal T2 of the second portion 130 of the test signal line 13 is configured to be covered by the bonding connector 5.

As used herein, the term "substantially parallel" refers to a surface, vertical to an extending direction of the test signal line 13, of the end of the second terminal of the second portion of the test signal line and the main surface of the edge E of the array substrate finning a dihedral angle between them, and the dihedral angle is in a range of 0 degree to approximately 15 degrees, e.g., 0 degree to approximately 1 degree, approximately 1 degree to approximately 2 degrees, approximately 2 degree to approximately 5 degrees, approximately 5 degree to approximately 10 degrees, and approximately 10 degree to approximately 15 degrees.

Optionally, the bonding connector 5 includes a flexible protective film 52 and a bonding connection line 51 covered by the flexible protective film 52. Optionally, the flexible protective film 52 is made of polyethylene terephthalate (PET) materials.

Optionally, the bonding connector 5 includes a gold bump 53 electrically connected to the bonding pad 4. Optionally, conductor beads 15 are in the space between the bonding connector 5 and the bonding area 120 of the array substrate 1 to electrically connecting the gold bump 53 to the bonding pad 4. Optionally, an isotropic conductive film (ACF) 16 is between the bonding connector 5 and the bonding area 120 of the array substrate 1, for example, the anisotropic conductive film (ACF) 16 is formed in the space between the banding connector 5 and the bonding area 120 of the array substrate 1 to prevent water and oxygen from contacting the bonding connector 5 and the bonding area 120 of the array substrate 1.

In some embodiments, when the bonding connector 5 is connected to the bonding pad 4, a surface S of the bonding connector 5 is in direct contact with the edge E of the array substrate 1. Because the end of the second terminal T2 of the second portion 130 of the test signal line 13 is along the edge E of the array substrate 1, the end of the second terminal T2 of the second portion 130 of the test signal line 13 is also in direct contact with the surface S of the bonding connector 5, so the end of the second terminal T2 of the second portion 130 of the test signal line 13 is covered by the surface S of the bonding connector 5. Optionally, the end of the second terminal T2 alto second portion 130 of the test signal line 13 is covered by the anisotropic conductive film (ACF) 16.

Moreover, the end of the second terminal T2 of the second portion 130 of the test signal line 13 is in direct contact with the surface S of the bonding connector 5, water and oxygen is prevented from eroding the end of the second terminal T2 of the second portion 130 of the test signal line 13 and further eroding the second portion 130 of the test signal line 13.

Optionally, the test signal line 13 is made of conductive metal materials. By covering the end of the second terminal T2 of the second portion 130 of the test signal line 13 using the bonding connector 5, Wilier and oxygen is prevented from eroding the end of the second terminal T2 of the second portion 130 of the test signal line 13 and further eroding the second portion 130 of the test signal line 13. Static electricity can also be prevented from entering the array substrate 1 through the end of the second terminal T2 of the second portion 130 of the test signal line 13, which may avoid defects of the array substrate.

Referring to FIG. 2, by depositing the wend portion 130 of the test signal line 13 in the bonding area 120, the end of the second terminal T2 of the second portion 130 of the test signal line 13 is along the edge E of the array substrate 1. When the array substrate 1 is connected to the peripheral circuit, the edge E of the array substrate 1 is covered by the bonding connector 5, the end of the second terminal T2 of the second portion 130 of the test signal line 13 is covered by the bonding connector 5 as well. The end of the second terminal T2 of the second portion 130 of the test signal line 13 will not be exposed to air, which may avoid erosions or electrostatic damages on the second portion 130 of the test signal line 13 and avoid adversary effects on the quality of the array substrate.

Figure 3:
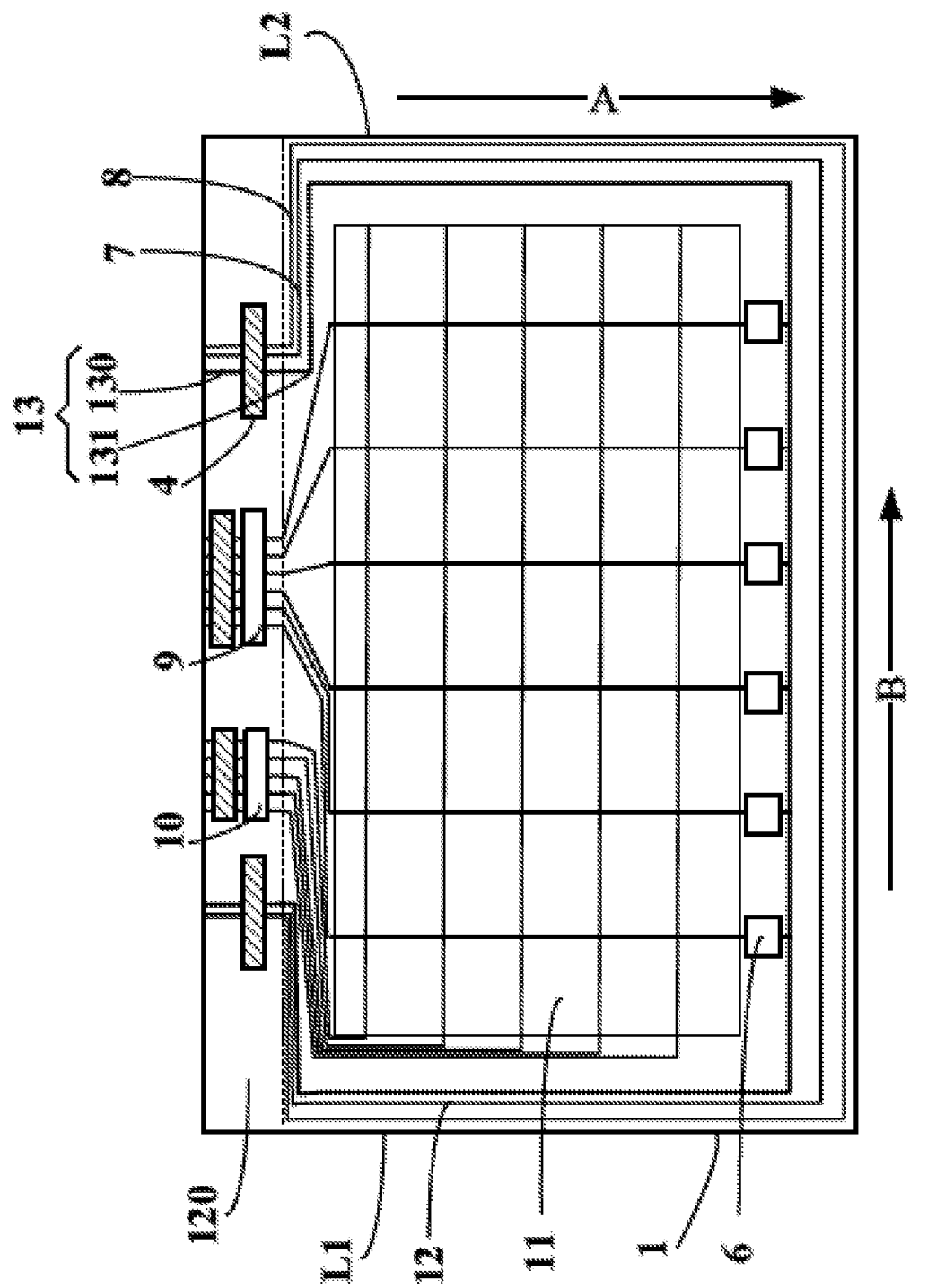
FIG. 3 is a plan view of an array substrate in some embodiments according to the present disclosure.

FIG. 3 is a plan view of an array substrate in some embodiments according to the present disclosure. Referring to FIG. 3, in some embodiments, the array substrate 1 further includes a plurality of data lines extending along a direction A from the bonding area 120 to a side of the array substrate 1 opposite to the bonding area 120.

Optionally, the first portion 131 of the test signal line 13 substantially surrounds the display area 11 to be connected to different signal lines and different electrodes in the array substrate to perform the process of testing the array substrate 1. For example, the first portion 131 of the test signal line 13 is connected to a data line. For example, the first portion 131 of the test signal line 13 is connected to a gate line. For example, the first portion 131 of the test signal line 13 is connected to a gate electrode, a common electrode, or a source/drain electrode.

Optionally, the test signal line 13 is electrically connected to the plurality of data lines on the side of the array substrate 1 opposite to the bonding area 120.

Optionally, the array substrate further includes a plurality of data line repair shorting structures 6 on the side of the array substrate 1 opposite to the bonding area 120. Optionally, the test signal line 13 is electrically connected to a respective one of the plurality of data lines respectively through a respective one of the plurality of data line repair aborting structures 6.

Optionally, the test signal line 13 is an array data pad opposite data (ADD) line for detecting deflects in the plurality of data lines of the array substrate 1. For example, in the process of testing the array substrate 1, a low level voltage is input in the ADD line (e.g. the test signal line 13), a voltage at an end of a respective one of the plurality of data lines connecting with the ADD line (e.g. the test signal line 13) is set to a low level, due to the low level voltage input in the ADD line (e.g. the test signal line 13). A high level voltage is input in the other end of the respective one of the plurality of data lines. If there is a break on the respective one of the plurality of data lines, there will be a voltage difference in the break region. Based on the voltage difference, it is easy to find any break region in the respective one of plurality of data lines. After locating the break region, the subsequent repair can be performed.

Subsequent to testing the array substrate, optionally, the second portion 130 of the test signal line 13 is floating. Optionally, the second portion 130 of the test signal line 13 is used as a common signal line inputting common signal into the array substrate 1.

Optionally, the test signal line 13 and the plurality of data lines are in a same layer and includes a same material, which may lower the cost of fabricating the base substrate.

As used herein, the term "same layer" refers to the relationship between the layers simultaneously formed in the same dep. In one example, the test signal line 13 and the plurality of data lines are in a same layer when they are formed as a result of one or more steps of a same patterning process performed in a same layer of material. In another example, the test signal line 13 and the plurality of data lines can be formed in a same layer by simultaneously performing the step of forming the test signal line 13 and the step of forming the plurality of data lines. The term "same Layer" does not always mean that the thickness of the layer or the height of the layer in a crass-sectional view is the same.

In some embodiments, the bonding area 120 is closer to a side of array substrate 1 to allow the connection between the bonding area 120 and the bonding connecter 5 on the side of the array substrate 1, which may allow the three remaining sides of the array substrate 1 to have a narrow frame. In some embodiments, there are more than one test signal lines on the bonding area 120. When the array substrate 1 is connected to the peripheral circuit through the bonding connector 5, ends (e.g., exposed ends) of the second terminals of the second portions of the more than one test signal line can be covered by the bonding connector 5. The ends of the second terminals of the second portions of the more than one test signal lines will not be exposed to air, which may avoid erosion or electrostatic damage on the second portions of the more than one test signal lines and avoid adversary effects on the quality of the array substrate.

In some embodiments, the array substrate 1 further includes a plurality of gate lines extending along a direction B from a first lateral side L1 of the array substrate 1 to a second lateral side L2 of the array substrate 1. For example, the first lateral side L1 and the second lateral side L2 respectively connects a side of the array substrate having the bonding area 120 and a side of the array substrate opposite to the bonding area 120.

Optionally, the array substrate 1 is absent of any exposed end of the test signal line 13 along edges of the first lateral side L1 and the second lateral side L2 of the array substrate. Optionally, the array substrate is absent of any exposed end of the test signal line 13 along edges of the side of the array substrate opposite to the bonding area 120.

Optionally, the test signal line 13 and the plurality of gate lines are in a same layer and include a same material, which may lower the cost of fabricating the array substrate.

Optionally, an insulating layer is between the plurality of gate lines and the plurality of data lines.

In some embodiment, the array substrate 1 further includes a ground voltage line 7 and a common voltage signal line 8 in the peripheral area 12. Optionally, the ground voltage line 7 is in the peripheral area 12 and substantially surrounds the display area 11. Optionally, the common voltage signal line 8 is in the peripheral area 12 and substantially surrounds the display area 11. Optionally, the test signal line 13 does not cross over the ground voltage line 7 and does not cross over the common voltage signal line 8.

In some embodiments, the array substrate 1 further includes a data driving circuit 9 in the bonding area 120, and a gate driving circuit 10 in the bonding area 120. The bonding area 120 allows a connection between the data driving circuit 9 and the peripheral circuit, a connection between the gate driving circuit 10 and the peripheral circuit. This arrangement may allow the three remaining sides of the array substrate to have a narrow frame. Moreover, the end of the second terminal T2 of the second portion 130 of the test signal line 13 will not be exposed to air, which may avoid erosions or electrostatic damages on the second portion 130 of the test signal line 13 and avoid adversary effects on the quality of the array substrate.

Figure 4:
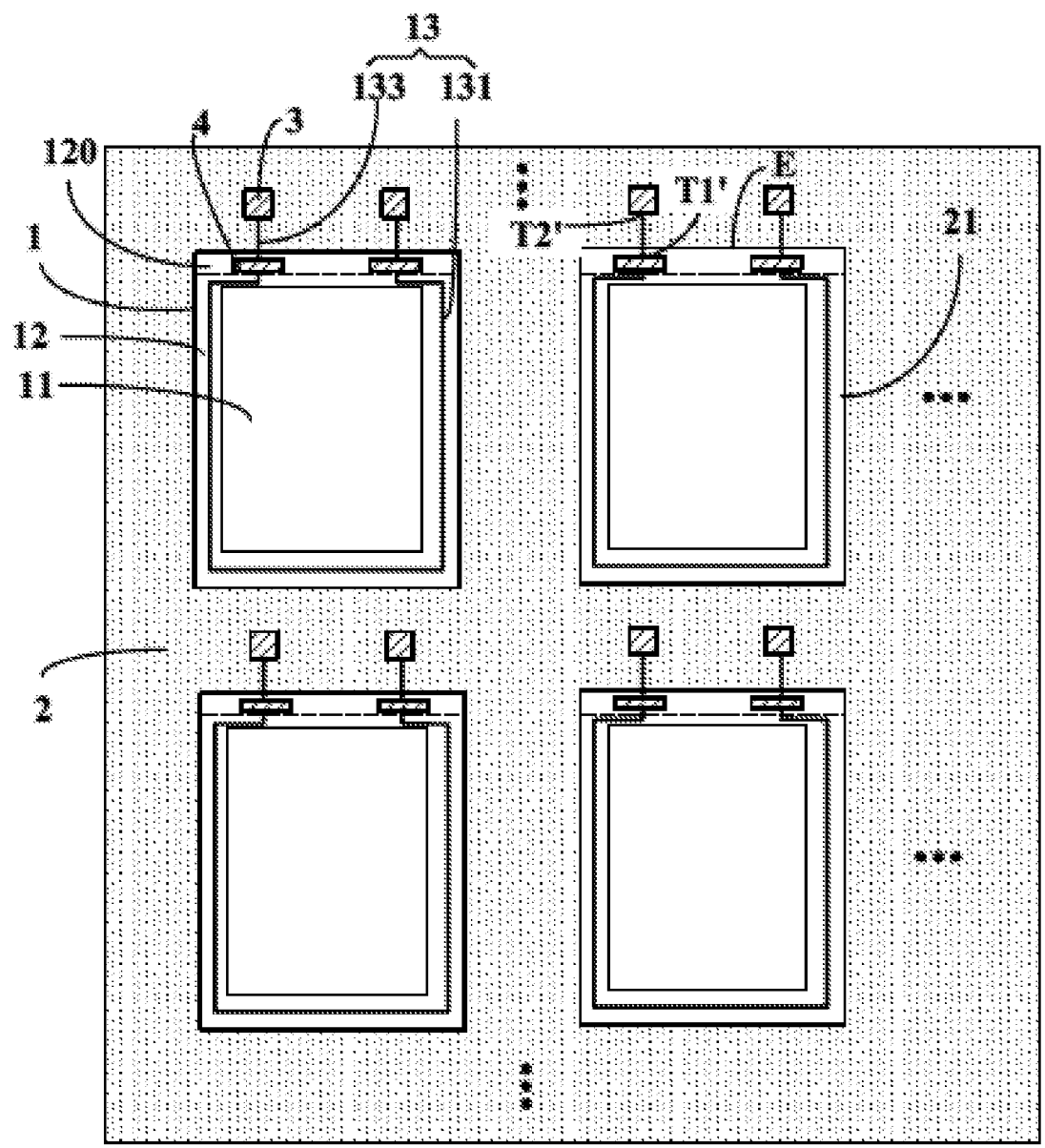
FIG. 4 is a plan view of a mother substrate in some embodiments according to the present disclosure.

In another aspect, the present disclosure provides a mother substrate. FIG. 4 is a plan view of a mother substrate in some embodiments according to the present disclosure. Referring to FIG. 4, in some embodiments, the mother substrate has a plurality of substrate regions 21 and a cutting region 2 spacing apart the plurality of substrate regions 21.

In some embodiments, the mother substrate includes an array substrate 1 in a respective one of the plurality of substrate regions 21; and a testing pad 3 in the cutting regions 2. Optionally, the testing pad 3 is used for inputting a testing signal.

In some embodiments, the array substrate 1 has a display area 11, a peripheral area 12, and a bonding area 120 inside the peripheral area 12. Optionally, the array substrate 1 includes a bonding pad 4 in the bonding area 120; and a test signal line 13. Optionally, the bonding pad 4 is configured to be connected to a peripheral circuit through a bonding connector 5.

In some embodiments, referring to FIG. 4, the test signal line 13 includes a first portion 131 and a third portion 133. In some embodiments, the first portion 131 is in the peripheral area 12 and substantially surrounds the display area 11. Optionally, the first portion 131 is electrically connected to the bonding pad 4. Optionally, the first portion 131 is completely inside the array substrate 1 and has no exposed terminal.

In some embodiments, the third portion 133 of the test signal line 13 extends from the bonding area 120 into the cutting region 2 to connect to the testing pad 3. Optionally, a first terminal T1' of the third portion 133 of the test signal line 13 is electrically connected to the bonding pad 4. Optionally, a second terminal T2' of the third portion 133 of the test signal line 13 is electrically connected to the testing pad 3.

Optionally, the mother substrate can be cut along a border between the respective one of the plurality of substrate regions 21 and the cutting region 2 to form the array substrate 1. The third portion 133 of the test signal line 13 is cut along the edge E of the array substrate 1 in the bonding area 120 to form a second potion 130 of the test signal line 13 shown in FIG. 1. Referring to FIG. 2, the second terminal T2 of the second portion 130 of the test signal line 13 has an end (e.g., an exposed end) along the edge E of the array substrate 1 in the bonding area 120.

Referring to both FIG. 2 and FIG. 4, the third portion 133 of the test signal line 13 is in the bonding area 120 and extends from the bonding area 120 into the cutting region 2 to connect to the testing pad 3. After cutting the mother substrate, the third portion 133 of the test signal line 13 is cut to form the second portion 130 of the test signal line 13, so the end of the second terminal T2 of the second portion 130 of the test signal line 13 is exposed along the edge E of the array substrate 1 in the bonding area 120. When the array substrate is connected to a peripheral circuit through a bonding connector 5, the bonding connector 5 covers the end of the second terminal 12 of the second portion 130 of the test signal line 13, to avoid erosions or electrostatic damages on the second portion 130 of the test signal line 13 and avoid adversary effects on the quality of the array substrate 1.

Figure 5:
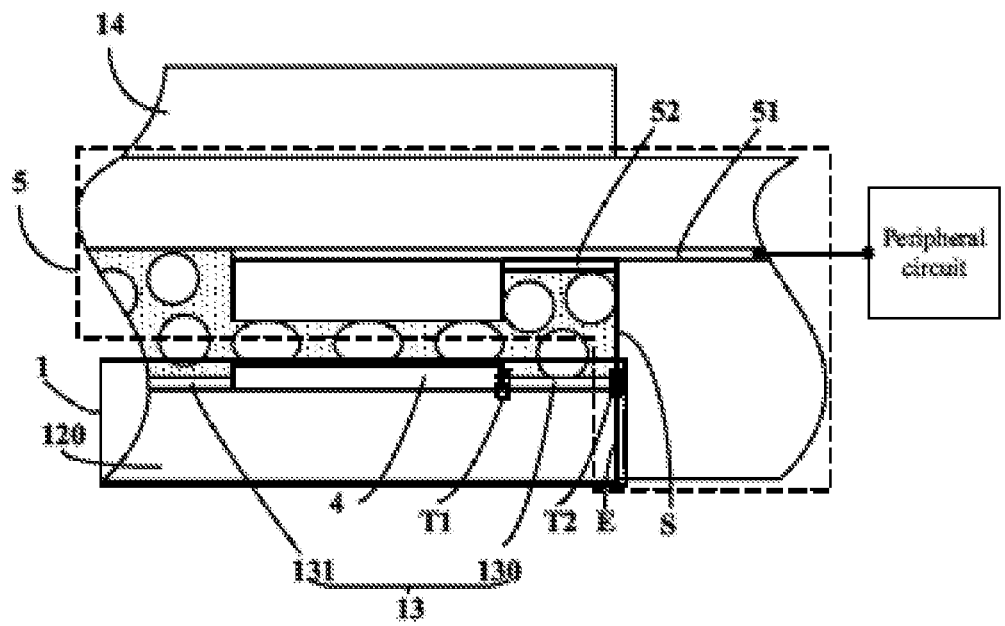
FIG. 5 is a partial cross-section view of a display panel in some embodiments according to the present disclosure.

In another aspect, the present disclosure also provides a display panel including the array substrate described herein. FIG. 5 is a partial cross-section view of a display panel in some embodiments according to the present disclosure. Referring to FIG. 5, in some embodiments, a display panel includes the array substrate 1 described herein; and a counter substrate 14 facing the array substrate 1; and a peripheral circuit connected to the bonding pad 4 through the bonding connector 5. Optionally, the counter substrate 14 and the array substrate 1 are assembled together into a cell.

Figure 6:
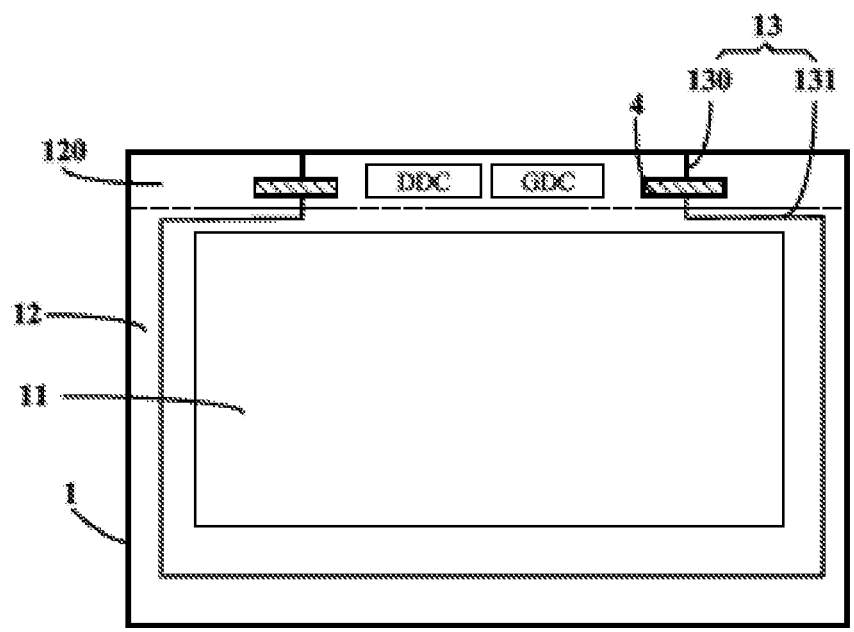
FIG. 6 is a plan view of an array substrate in a display panel in some embodiments according to the present disclosure.

FIG. 6 is a plan view of an array substrate in a display panel in some embodiments according to the present disclosure. Referring to FIG. 6, in some embodiments, the display panel further includes a data driving circuit DDC in the bonding area 120, and a gate driving circuit GDC in the bonding area 120.

Referring to FIG. 5, the bonding connector 5 includes a flexible protective film 52 and a bonding connection line 51 protected by the flexible protective film 52. Optimally, the bonding connection line 51 is electrically connected to the peripheral circuit. Optionally, the flexible protective film 52 is made of polyethylene terephthalate (PET) materials.

In some embodiments, the bonding connector 5 connects the bonding pad 4 to the peripheral circuit, the bonding connector 5 covers an end (e.g., an exposed end) of the test signal line 13 along an edge E of the array substrate 1 in the bonding area 120. Covering the end afire test signal line 13 using the bonding connector 5 can avoid erosions or electrostatic damages on the test signal line 13 and avoid adversary effects on the quality of the array substrate 1.

Optionally, the display panel is a liquid crystal display panel. Optionally, the display panel is an organic light omitting diode display panel.

In another aspect, the present disclosure also provides a display apparatus including the display panel described herein, and one or more integrated circuits connected to the display panel. Examples of appropriate display apparatuses include, but are not limited to, an electronic paper, a mobile phone, a tablet computer, a television, a monitor, a notebook computer, a digital album, a GPS, etc.

Figure 7:
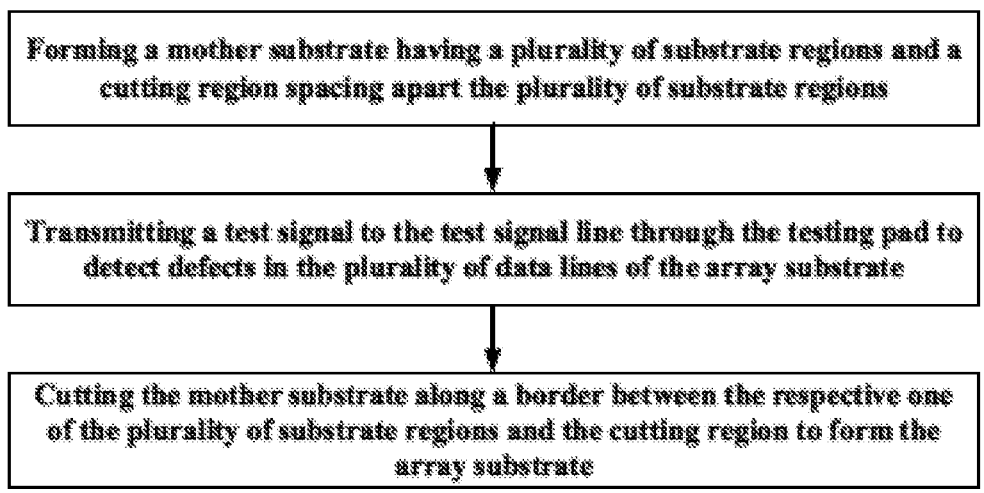
FIG. 7 is a flow chart illustrating a method of fabricating an array substrate in some embodiments according to the present disclosure.

In another example, the present disclosure also provides a method of fabricating an array substrate having a display area, a peripheral area, and a bonding area inside the peripheral area. FIG. 7 is a flow chart illustrating a method of fabricating an array substrate in some embodiments according to the present disclosure. Referring to FIG. 7, in some embodiments, the method of fabricating the array substrate includes forming a mother substrate having a plurality of substrate regions and a cutting region spacing apart the plurality of substrate regions; and cutting the mother substrate along a border between the respective one of the plurality of substrate regions and the cutting region to form the array substrate. Optionally, components of the array substrate are formed in a respective one of the plurality of substrate regions.

Optionally, subsequent to forming the mother substrate and prior to cutting the mother substrate, the method of fabricating the array substrate further includes transmitting a test signal to the test signal line through the testing pad to detect defects in the plurality of data lines of the array substrate.

In some embodiments, the method of fabricating the array substrate further includes forming a bonding pad in the bonding area; forming a test signal line including a first portion and a second portion.

Optionally, the bonding pad is configured to be connected to a peripheral circuit through a bonding connector.

Optionally, the first portion of the test signal line is formed in the peripheral area and substantially surrounds the display area. Optionally, the first portion of the test signal line is electrically connected to the bonding pad. Optionally, the first portion of the test signal line is completely inside the array substrate and has no exposed terminal.

Optionally, the second portion of the test signal line is formed in the bonding area. Optionally, a first terminal of the second portion is electrically connected to the bonding pad. Optionally, a second terminal of the second portion has an end (e.g., an exposed end) along an edge of the array substrate in the bonding area. Optionally, the end of the second terminal of the second portion is covered by the bonding connector.

In some embodiments, forming the mother substrate includes forming an array substrate in a respective one of the plurality of substrate regions; and forming a testing pad in the nutting regions. Optionally, the array substrate has a display area, a peripheral area, and a bonding area inside the peripheral area.

In some embodiments, forming the array substrate includes forming a bonding pad in the bonding area; forming a test signal line including a first portion and a third portion. Optionally, the bonding pad is configured to be connected to a peripheral circuit through a bonding connector.

Optically, the first portion is formed in the peripheral area and substantially surrounds the display area. Optionally, the first portion is electrically connected to the bonding pad. Optionally, the first portion is completely inside the array substrate and has no exposed terminal.

Optionally, the third portion extends from the bonding area into the cutting region to connect to the testing pad. Optionally, a first terminal of the third portion is electrically connected to the bonding pad. Optionally, a second terminal of the third portion is electrically connected to the testing pad.

In some embodiments, forming the array substrate further includes forming a plurality of data lines extending along a direction from the bonding area to a side of the array substrate opposite to the bonding area.

In some embodiment, cutting the mother substrate along the border between the respective one of the plurality of substrate regions and the cutting region cuts the third portion along an edge of the array substrate in the bonding area to form the second portion of the test signal line. Optionally, a first terminal of the second portion is electrically connected to the bonding pad. Optionally, a second terminal of the second portion has an end (e.g., an exposed end) along the edge of the array substrate in the bonding area. Optionally, the end of the second terminal of the second portion is configured to be covered by the bonding connector.

In some embodiments, subsequent to cutting the mother substrate, the method of fabricating the array substrate further includes applying a protective adhesive layer to cover the end of the second terminal of the second portion. Optionally, the end of the second terminal of the second portion is covered by the bonding connector.

Covering the end of the test signal line using the bonding connector can avoid erosions or electrostatic damages on the test signal line and avoid adversary effects on the quality of the array substrate.

In another spent, the present disclosure also provide a method of fabricating a display panel. In some embodiments, the method of fabricating the display panel includes the method of fabricating the array substrate described herein; connecting the bonding connector to the bonding pad; connecting a peripheral circuit to the bonding pad through the bonding connector; providing a counter substrate facing the array substrate; and assembling the array substrate and the counter substrate into a cell. Optionally, the end of the second terminal of the second portion is covered by the bonding connector.

Covering the end of the test signal line using the bonding connector can avoid erosions or electrostatic damages on the test signal line and avoid adversary effects on the quality of the array substrate.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as it rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate having a display area, a peripheral area, and a bonding area inside the peripheral area, comprising:
    a bonding pad in the bonding area, the bonding pad configured to be connected to a peripheral circuit through a bonding connector;
    a test signal line comprising a first portion and a second portion;
    wherein the first portion is in the peripheral area and substantially surrounds the display area;
    the first portion is electrically connected to the bonding pad;
    the first portion is completely inside the array substrate and has no exposed terminal;
    the second portion is in the bonding area;
    a first terminal of the second portion is electrically connected to the bonding pad; and
    a second terminal of the second portion has an end along an edge of the array substrate in the bonding area.

2. The array substrate of claim 1, further comprising a plurality of data lines extending along a direction from the bonding area to a side of the array substrate opposite to the bonding area;
    wherein the test signal line is an array data pad opposite data (ADD) line for detecting defects in the plurality of data lines of the array substrate.

3. The array substrate of claim 2, wherein the test signal line is electrically connected to the plurality of data lines on the side of the array substrate opposite to the bonding area.

4. The array substrate of claim 3, further comprising a plurality of electrostatic discharge shorting structures on the side of the array substrate opposite to the bonding area;
wherein the test signal line is electrically connected to the plurality of data lines respectively through the plurality of electrostatic discharge shorting structures.

5. The array substrate of claim 2, wherein the test signal line and the plurality of data lines are in a same layer and comprise a same material.

6. The array substrate of claim 1, further comprising a plurality of gate lines extending along a direction from a first lateral side of the array substrate to a second lateral side of the array substrate, the first lateral side and the second lateral side respectively connecting a side of the array substrate having the bonding area and a side of the array substrate opposite to the bonding area;
wherein the array substrate is absent of any exposed ends of the test signal line along edges of the first lateral side and the second lateral side of the array substrate.

7. The array substrate of claim 6, wherein the test signal line and the plurality of gate lines are in a same layer and comprise a same material.

8. The array substrate of claim 1, further comprising a ground voltage line and a common voltage signal line in the peripheral area;
wherein the test signal line does not cross over the ground voltage line and does not cross over the common voltage signal line.

9. The array substrate of claim 1, wherein the end of the second terminal of the second portion is configured to be covered by the bonding connector.

10. A display panel, comprising the array substrate of claim 1;
a counter substrate facing the array substrate;
the bonding connector connected to the bonding pad;
a peripheral circuit connected to the bonding pad through the bonding connector;
a data driving circuit in the bonding area; and
a gate driving circuit in the bonding area.

11. The display panel of claim 10, wherein the bonding connector comprises a flexible protective film and a bonding connection line protected by the flexible protective film.

12. A method of fabricating an array substrate having a display area, a peripheral area, and a bonding area inside the peripheral area, comprising:
forming a bonding pad in the bonding area, the bonding pad configured to be connected to a peripheral circuit through a bonding connector;
forming a test signal line comprising a first portion and a second portion;
wherein the first portion is formed in the peripheral area and substantially surrounds the display area;
the first portion is electrically connected to the bonding pad;
the first portion is completely inside the array substrate and has no exposed terminal;
the second portion is formed in the bonding area;
a first terminal of the second portion is electrically connected to the bonding pad; and
a second terminal of the second portion has an end along an edge of the array substrate in the bonding area.

13. The method of claim 12, comprising:
forming a mother substrate having a plurality of substrate regions and a cutting region spacing apart the plurality of substrate regions, wherein components of the array substrate are formed in a respective one of the plurality of substrate regions;
cutting the mother substrate along a border between the respective one of the plurality of substrate regions and the cutting region, thereby forming the array substrate.

14. The method of claim 13, wherein forming the mother substrate comprises:
forming an array substrate in a respective one of the plurality of substrate regions; and
forming a testing pad in the cutting region;
wherein the array substrate has a display area, a peripheral area, and a bonding area inside the peripheral area;
wherein forming the array substrate comprises:
forming a bonding pad in the bonding area, the bonding pad configured to be connected to a peripheral circuit through a bonding connector;
forming a test signal line comprising a first portion and a third portion;
wherein the first portion is formed in the peripheral area and substantially surrounds the display area;
the first portion is electrically connected to the bonding pad;
the first portion is completely inside the array substrate and has no exposed terminal;
the third portion extends from the bonding area into the cutting region to connect to the testing pad;
a first terminal of the third portion is electrically connected to the bonding pad; and
a second terminal of the third portion is electrically connected to the testing pad.

15. The method of claim 14, wherein forming the array substrate further comprises forming a plurality of data lines extending along a direction from the bonding area to a side of the array substrate opposite to the bonding area;
wherein, subsequent to forming the mother substrate and prior to cutting the mother substrate, the method further comprises transmitting a test signal to the test signal line through the testing pad to detect defects in the plurality of data lines of the array substrate.

16. The method of claim 14, wherein cutting the mother substrate along the border between the respective one of the plurality of substrate regions and the cutting region cuts the third portion along an edge of the array substrate in the bonding area, thereby forming the second portion;
a first terminal of the second portion is electrically connected to the bonding pad; and
a second terminal of the second portion has an end along the edge of the array substrate in the bonding area; and
the end of the second terminal of the second portion is configured to be covered by the bonding connector.

17. The method of claim 14, subsequent to cutting the mother substrate, further comprising applying a protective adhesive layer to cover the end of the second terminal of the second portion.

18. The method of claim 12, wherein the end of the second terminal of the second portion is covered by the bonding connector.

19. A method of fabricating a display panel, comprising the method of fabricating the array substrate of claim 15;
connecting the bonding connector to the bonding pad, wherein the end of the second terminal of the second portion is covered by the bonding connector;
connecting a peripheral circuit to the bonding pad through the bonding connector;
providing a counter substrate facing the array substrate; and assembling the array substrate and the counter substrate into a cell.

20. A mother substrate having a plurality of substrate regions and a cutting region spacing apart the plurality of substrate regions, comprising:
   an array substrate in a respective one of the plurality of substrate regions; and
   a testing pad in the cutting regions;
   wherein the array substrate has a display area, a peripheral area, and a bonding area inside the peripheral area;
   wherein the array substrate comprises:
   a bonding pad in the bonding area, the bonding pad configured to be connected to a peripheral circuit through a bonding connector;
   a test signal line comprising a first portion and a third portion;
   wherein the first portion is in the peripheral area and substantially surrounds the display area;
   the first portion is electrically connected to the bonding pad;
   the first portion is completely inside the array substrate and has no exposed terminal;
   the third portion extends from the bonding area into the cutting region to connect to the testing pad;
   a first terminal of the third portion is electrically connected to the bonding pad; and
   a second terminal of the third portion is electrically connected to the testing pad.

* * * * *